(12) United States Patent
Hack et al.

(10) Patent No.: US 12,720,993 B2
(45) Date of Patent: Aug. 25, 2026

(54) ORGANIC ELECTROLUMINESCENT DEVICES

(71) Applicant: Universal Display Corporation, Ewing, NJ (US)

(72) Inventors: Michael Hack, Carmel, CA (US); Michael Stuart Weaver, Princeton, NJ (US); Eric A. Margulies, Philadelphia, PA (US); Lorne A. Whitehead, Vancouver (CA)

(73) Assignee: Universal Display Corporation, Ewing, NJ (US)

( * ) Notice: Subject to any disclaimer, the term of this patent is extended or adjusted under 35 U.S.C. 154(b) by 756 days.

(21) Appl. No.: 18/102,212

(22) Filed: Jan. 27, 2023

(65) Prior Publication Data

US 2023/0247884 A1 Aug. 3, 2023

Related U.S. Application Data

(60) Provisional application No. 63/338,929, filed on May 6, 2022, provisional application No. 63/305,924, filed on Feb. 2, 2022.

(51) Int. Cl.
*H10K 59/35* (2023.01)
*H10K 59/80* (2023.01)

(52) U.S. Cl.
CPC ..... *H10K 59/353* (2023.02); *H10K 59/80518* (2023.02); *H10K 59/876* (2023.02); *H10K 59/8793* (2023.02)

(58) Field of Classification Search
CPC ........... H10K 59/353; H10K 59/80518; H10K 59/876; H10K 59/8793; H10K 59/875;
(Continued)

(56) References Cited

U.S. PATENT DOCUMENTS 4,769,292 A 9/1988 Tang
5,247,190 A 9/1993 Friend
(Continued)

FOREIGN PATENT DOCUMENTS

WO 2008057394 A1 5/2008
WO 2010011390 A2 1/2010

OTHER PUBLICATIONS

Baldo et al. "Highly efficient phosphorescent emission from organic electroluminescent devices", Nature, vol. 395, pp. 151-154, 1998.
(Continued)

*Primary Examiner* — Jacob Y Choi
*Assistant Examiner* — Ashley Nicole Blackwell
(74) *Attorney, Agent, or Firm* — Butzel Long

(57) ABSTRACT

Embodiments of the disclosed subject matter provide a device including an organic light emitting device (OLED) display having at least one pixel having a plurality of sub-pixels, where at least one color sub-pixel of the plurality of sub-pixels may be configured to output red light, green light, and/or blue light. The device may include at least one sub-pixel that is configured to have a Lambertian emission, and at least one sub-pixel having a microcavity configured for direct emission such that a first ratio of light from the direct emission sub-pixel in a cone having an angle of 0-20° in a normal direction relative to an overall light emission from the direct emission sub-pixel having at least 10%, at least 20%, and/or at least 30% higher than a second ratio of light from the Lambertian emission sub-pixel.

19 Claims, 4 Drawing Sheets

(58) Field of Classification Search
CPC .. H10K 59/35; H10K 59/805; H10K 59/8791; G09G 3/3208; G09G 5/02; G09G 2300/0452; G09G 2320/028; G09G 2340/06
See application file for complete search history.

(56) References Cited

U.S. PATENT DOCUMENTS

| | | | | |
|---|---|---|---|---|
| 5,703,436 | A | 12/1997 | Forrest | |
| 5,707,745 | A | 1/1998 | Forrest | |
| 5,834,893 | A | 11/1998 | Bulovic | |
| 5,844,363 | A | 12/1998 | Gu | |
| 6,013,982 | A | 1/2000 | Thompson | |
| 6,087,196 | A | 7/2000 | Sturm | |
| 6,091,195 | A | 7/2000 | Forrest | |
| 6,097,147 | A | 8/2000 | Baldo | |
| 6,294,398 | B1 | 9/2001 | Kim | |
| 6,303,238 | B1 | 10/2001 | Thompson | |
| 6,337,102 | B1 | 1/2002 | Forrest | |
| 6,468,819 | B1 | 10/2002 | Kim | |
| 6,537,688 | B2 | 3/2003 | Silvernail | |
| 6,597,111 | B2 | 7/2003 | Silvernail | |
| 6,664,137 | B2 | 12/2003 | Weaver | |
| 6,835,950 | B2 | 12/2004 | Brown | |
| 6,888,305 | B2 | 5/2005 | Weaver | |
| 6,888,307 | B2 | 5/2005 | Silvernail | |
| 6,897,474 | B2 | 5/2005 | Brown | |
| 7,187,119 | B2 | 3/2007 | Weaver | |
| 7,279,704 | B2 | 10/2007 | Walters | |
| 7,431,968 | B1 | 10/2008 | Shtein | |
| 7,683,534 | B2 | 3/2010 | Weaver | |
| 7,968,146 | B2 | 6/2011 | Wagner | |
| 8,228,275 | B2 | 7/2012 | Langendijk | |
| 2003/0230980 | A1 | 12/2003 | Forrest | |
| 2004/0174116 | A1 | 9/2004 | Lu | |
| 2009/0051283 | A1* | 2/2009 | Cok | H10K 59/876 313/506 |
| 2017/0061842 | A1* | 3/2017 | Cok | G09G 3/2003 |
| 2017/0229663 | A1 | 8/2017 | Tsai | |
| 2021/0351383 | A1* | 11/2021 | Hung | H10K 59/875 |

OTHER PUBLICATIONS

Baldo, et al., “Very high-efficiency green organic light-emitting devices based on electrophosphorescence”, Applied Physics Letters, Jul. 5, 1999, 4 pp., vol. 75, No. 1, American Institute of Physics, Melville, NY, USA.

* cited by examiner

ORGANIC ELECTROLUMINESCENT DEVICES

CROSS-REFERENCE TO RELATED APPLICATIONS

This application claims priority to U.S. Patent Application Ser. No. 63/338,929, filed May 6, 2022, and to U.S. Patent Application Ser. No. 63/305,924, filed Feb. 2, 2022, the entire contents of each are incorporated herein by reference.

FIELD

The present invention relates to organic emissive devices with a plurality of sub-pixels, where a display usage mode may be switched between different modes for display properties such as color, viewing angle, and/or transparency, and techniques for fabricating the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; Interior: [0.2268, 0.3321] |
| Central Yellow | Locus: [0.373 l, 0.6245]; [0.6270, 0.3725]; Interior: [0.3 700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device may include an organic light emitting device (OLED) display having at least one pixel having a plurality of sub-pixels, where at least one color sub-pixel of the plurality of sub-pixels is configured to output red light, at least one color sub-pixel of the plurality of sub-pixels is configured to output green light, and/or at least one color sub-pixel of the plurality of sub-pixels is configured to output blue light. The device may include at least two of the at least one color sub-pixel configured to output red light, the at least one color sub-pixel configured to output green light, and the at least one color sub-pixel configured to output blue light have at least one sub-pixel that is configured to have a Lambertian emission, and at least one sub-pixel having a microcavity that may be configured for direct emission such that a first ratio of light from the direct emission sub-pixel in a cone having an angle of 0-20° in a normal direction relative to an overall light emission from the direct emission sub-pixel that may be at least 10%, at least 20%, and/or at least 30% higher than a second ratio of light from the Lambertian emission sub-pixel in a cone having an angle of 0-20° in a normal direction relative to an overall light emission from the Lambertian sub-pixel.

The device may include a controller to control the OLED display, where a ratio between a luminance of the at least one sub-pixel configured to have the direct emission and the at least one sub-pixel may be configured to have the Lambertian emission increases when the controller controls the OLED display to increase a luminance of the OLED display.

The device may include a controller to control the OLED display, where a ratio between a luminance of the at least one sub-pixel configured to have the direct emission and the at least one sub-pixel configured to have the Lambertian emission may be increased based on a color of a pixel of the at least one pixel of the OLED display.

The device may include a controller to control the OLED display, where a ratio between a luminance of the at least one sub-pixel may be configured to have the direct emission and the at least one sub-pixel may be configured to have the Lambertian emission changes across the OLED display based on at least one control signal output by the controller.

The controller of the device may be configured to control the OLED display, where CIE 1931 color space values for a pixel that may include the at least one sub-pixel configured to have the Lambertian emission and the at least one sub-pixel may be configured to have the direct emission change based on at least one control signal output by the controller.

The at least one color sub-pixel of the plurality of sub-pixels of the device may be configured to output light of another color. The device may be configured to output light using at least two of the at least one color sub-pixel configured to output red light, the at least one color sub-pixel configured to output green light, the at least one color sub-pixel configured to output blue light, and/or the at least one color sub-pixel configured to output light of another color. The device may be configured with the at least one sub-pixel having Lambertian emission for each color and the at least one sub-pixel having the microcavity configured for direct emission for each color.

The device may include at least one circular polarizer that may be patterned over regions of the OLED display having at least one reflective electrode. The at least one reflective electrode may be a backplane electrode of the OLED display, and/or an electrode for a cavity OLED stack of the OLED display.

The device may include at least one circular polarizer that is patterned over regions of the OLED display having direct or microcavity emission.

The device may include at least one circular polarizer that is disposed over less than 80%, less than 60%, less than 40%, less than 20%, and/or less than 10% of an active area of the OLED display.

The controller of the device may be configured to select the at least one sub-pixel that has the Lambertian emission and the at least one sub-pixel having the microcavity configured for direct emission based on an image to be displayed by the OLED display, and/or an operating mode of the OLED display.

The device having at least one sub-pixel that has the Lambertian emission and the at least one sub-pixel having the microcavity may be configured for direct emission have different or the same emitters.

The device having at least one sub-pixel that has the Lambertian emission and the at least one sub-pixel having the microcavity may be configured for direct emission have different emitters or the same emitters for each color, where each color has a peak wavelength that is substantially the same and different full width at half maximum (FWHM), and/or different peak wavelengths.

At least one sub-pixel of the plurality of sub-pixels of the device may be a phosphorescent sub-pixel, and/or a phosphorescence sensitized fluorescence sub-pixel.

At least one sub-pixel of the plurality of sub-pixels of the device may have an emissive layer including a phosphorescent material.

The controller of the device may be configured to select a color gamut of the OLED display, where the color gamut may be selected by the controller by selecting one of the at least one color sub-pixel that is configured to output red light, selecting one of the at least one color sub-pixel that is configured to output green light, and/or selecting one of the at least one color sub-pixel configured to output blue light. The controller may be configured to control the OLED display so that only one sub-pixel configured to output red light, green light, and/or blue light in any given pixel is illuminated at the same time.

The controller of the device may be configured to select a viewing angle of the OLED display, where the viewing angle may be selected by the controller by selecting one of the at least one color sub-pixel that is configured to output red light, selecting one of the at least one color sub-pixel that is configured to output green light, and/or selecting one of the at least one color sub-pixel configured to output blue light.

The controller of the device may be configured to select a transmission parameter of the OLED display to control an emission of light from the OLED display.

The controller of the device may be configured to select a distribution of the red light, the green light, and/or the blue light through at least one of an anode and a cathode of the OLED display.

The controller of the device may be configured to control a luminance of white light output by the OLED display by controlling the at least one color sub-pixel configured to output red light, the at least one color sub-pixel configured to output green light, and/or the at least one color sub-pixel configured to output blue light.

The OLED display of the device may have only three OLED emitter depositions, where a first OLED emitter deposition includes the at least one color sub-pixel configured to emit red light, a second OLED emitter deposition includes the at least one color sub-pixel configured to emit green light, and/or a third OLED emitter deposition that includes the at least one color sub-pixel configured to emit blue light. The OLED display of the device may have more than one deposition for sub-pixels configured to emit red light, green light, and/or blue light.

The OLED display of the device may include more than three OLED emitter depositions, where two or more depositions are used for a sub-pixel of the plurality of sub-pixels that is configured to output a first color of light and/or a second color light, where the first color and the second color are similar within a predetermined range of wavelengths.

The OLED display of the device may have a plurality of OLED depositions, where a first OLED emitter deposition includes the at least one color sub-pixel configured to emit red light, a second OLED emitter deposition includes the at least one color sub-pixel configured to emit green light, a third OLED emitter deposition that includes the at least one color sub-pixel configured to emit blue light, and/or a fourth OLED emitter deposition that includes at least one color sub-pixel configured to emit yellow light.

The OLED display of the device may have a plurality of OLED depositions, where a first OLED emitter deposition is configured to produce blue light, and where the at least one pixel configured to emit blue light uses the blue light produced from the first OLED emitter deposition. A second OLED deposition may be configured to produce yellow light. The at least one sub-pixel configured to output red light may use at least one color altering layer and the yellow light produced from the second OLED deposition, the at least one sub-pixel configured to emit green light may use the at least one color altering layer and the yellow light produced from the second OLED deposition.

The at least one color sub-pixel of the plurality of sub-pixels of the device configured to output red light may include at least a first color sub-pixel and a second color sub-pixel. The at least one color sub-pixel of the plurality of sub-pixels that is configured to output green light may include at least a third color sub-pixel and a fourth color sub-pixel. The at least one color sub-pixel of the plurality of sub-pixels that is configured to output blue light may include at least a fifth color sub-pixel and a sixth color sub-pixel. The device may have a plurality of data lines for each pixel of the plurality of pixels, with a first data line to provide data to the first color sub-pixel and the second color sub-pixel, a second data line to provide data to the third color sub-pixel and the fourth color sub-pixel, a third data line to provide data to the fifth color sub-pixel and the sixth color sub-pixel. The device may have a plurality of scan lines for each pixel of the plurality of pixels, with a first scan line coupled to the first color sub-pixel, the third color sub-pixel, and the fifth color sub-pixel, and a second scan line coupled to the second color sub-pixel, the fourth color sub-pixel, and the sixth color sub-pixel. The first color sub-pixel, the third color sub-pixel, and the fifth color sub-pixel may be at least semi-transparent or transparent. The first color sub-pixel, the third color sub-pixel, and the fifth color sub-pixel may have a different cavity design than the second color sub-pixel, the fourth color sub-pixel, and the sixth color sub-pixel.

The device may include three data lines to provide data to each pixel of the plurality of pixels and may have two scan lines for each pixel of the plurality of pixels, where an anode property, a cathode property, and/or a common layer thickness differs in alternate row of the plurality of pixels.

The device may include an anode property, a cathode property, and/or a common layer thickness differs in sub-pixels of the same color within each pixel of the OLED display.

The device may include an enhancement layer that is disposed over an emissive area of the at least one sub-pixel that is configured to have a Lambertian emission and/or the least one sub-pixel having a microcavity configured for direct emission. The enhancement layer may include a plasmonic structure that is disposed a predetermined threshold distance from the emissive area. The predetermined threshold distance may be a distance at which a total non-radiative decay rate constant is equal to a total radiative decay rate constant.

The device may include an outcoupling layer that is disposed over the enhancement layer on the opposite side of the emissive area.

According to an embodiment, a method may include depositing material for a plurality of pixels of an organic light emitting device (OLED) device using a mask. The mask may have a shape configured to deposit a blocking or prime layer in at least three sub-pixels of each pixel of the plurality of pixels to be deposited. At least one color sub-pixel of the at least three sub-pixels plurality of sub-pixels deposited may be configured to output red light, at least one color sub-pixel of the at least three sub-pixels is configured to output green light, and at least one color sub-pixel of the at least three sub-pixel is configured to output blue light.

The method may include having a cavity length of the at least one color sub-pixel configured to output red light, the at least one color sub-pixel configured to output green light, or the at least one color sub-pixel configured to output blue light is different via common layers deposited under at least one more adjacent sub-pixels.

The method may include forming different cavity optics for the more than one color sub-pixel configured to output red light, the more than one color sub-pixel configured to output green light, and/or the more than one color sub-pixel configured to output blue light.

According to an embodiment, a consumer electronic device may include an organic light emitting device (OLED) display having at least one pixel having a plurality of sub-pixels. At least one color sub-pixel of the plurality of sub-pixels may be configured to output red light, at least one color sub-pixel of the plurality of sub-pixels may be configured to output green light, at least one color sub-pixel of the plurality of sub-pixels may be configured to output blue light. The consumer electronic device may have at least two of the at least one color sub-pixel configured to output red light, the at least one color sub-pixel configured to output green light, and/or the at least one color sub-pixel configured to output blue light have at least one sub-pixel that is configured to have a Lambertian emission, and may have at least one sub-pixel having a microcavity configured for direct emission such that a first ratio of light from the direct emission sub-pixel in a cone having an angle of 0-20° in a normal direction relative to an overall light emission from the direct emission sub-pixel includes at least 10%, at least 20%, and/or at least 30% higher than a second ratio of light from the Lambertian emission sub-pixel in a cone having an angle of 0-20° in a normal direction relative to an overall light emission from the Lambertian sub-pixel.

The consumer electronic device may be a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls having multiple displays tiled together, a theater or stadium screen, and/or a sign.

According to an embodiment, a device may include an organic light emitting device (OLED) display having at least one pixel having a plurality of sub-pixels. The device may have at least one color sub-pixel of the plurality of sub-pixels is configured to output red light, at least one color sub-pixel of the plurality of sub-pixels is configured to output green light, and at least one color sub-pixel of the plurality of sub-pixels is configured to output blue light. The device may have at least two of the at least one color sub-pixel configured to output red light, the at least one color sub-pixel configured to output green light, and/or the at least one color sub-pixel configured to output blue light have a micro-optical element disposed over at least part of a sub-pixel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
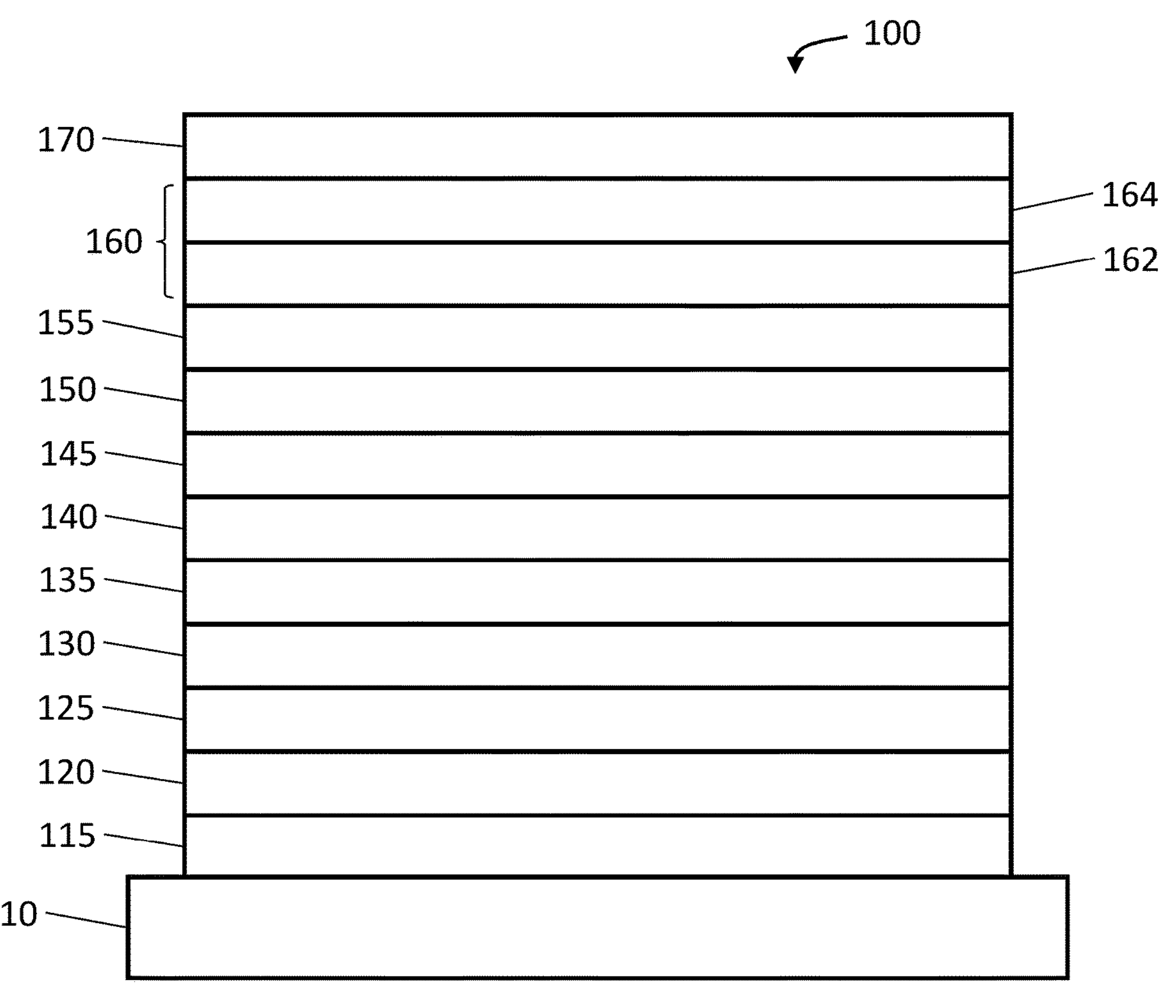
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. Barrier layer 170 may be a single- or multi-layer barrier and may cover or surround the other layers of the device. The barrier layer 170 may also surround the substrate 110, and/or it may be arranged between the substrate and the other layers of the device. The barrier also may be referred to as an encapsulant, encapsulation layer, protective layer, or permeation barrier, and typically provides protection against permeation by moisture, ambient air, and other similar materials through to the other layers of the device. Examples of barrier layer materials and structures are provided in U.S. Pat. Nos. 6,537,688, 6,597,111, 6,664,137, 6,835,950, 6,888,305, 6,888,307, 6,897,474, 7,187,119, and 7,683,534, each of which is incorporated by reference in its entirety.

Figure 2:
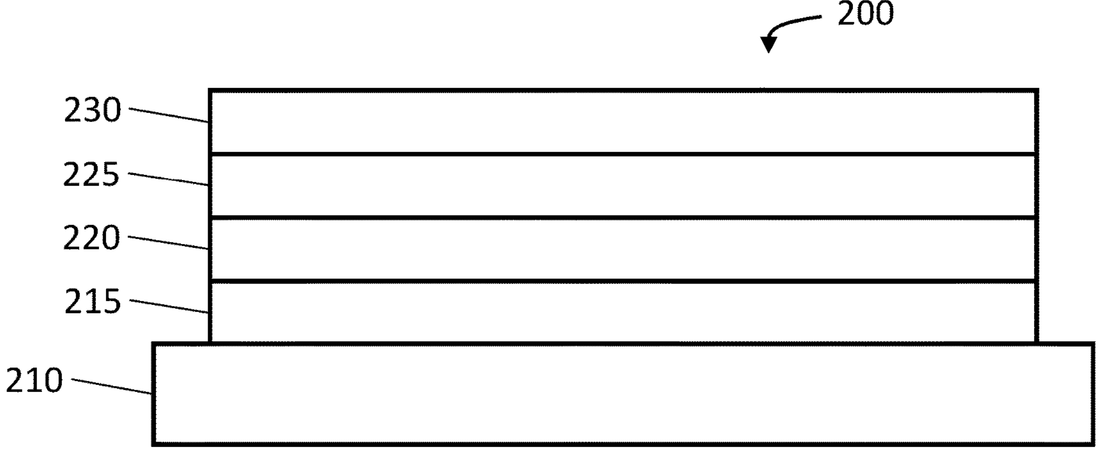
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. In general, an emissive layer includes emissive material within a host matrix. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light based on an injected electrical charge, where the initial light may be altered by another layer such as a color filter or other color altering layer that does not itself emit an initial light within the device, but may re-emit altered light of a different spectra content based upon absorption of the initial light emitted by the emissive layer and downconversion to a lower energy light emission. In some embodiments disclosed herein, the color altering layer, color filter, upconversion, and/or downconversion layer may be disposed outside of an OLED device, such as above or below an electrode of the OLED device.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, where the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a pluraility of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles where the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

In embodiments of the disclosed subject matter, a device may include an enhancement layer that is disposed over an emissive area of at least one sub-pixel that is configured to have a Lambertian emission and/or at least one sub-pixel having a microcavity configured for direct emission, as described in detail below. In at least some of such embodiments, the enhancement layer may include a plasmonic structure that is disposed a predetermined threshold distance from the emissive area. The predetermined threshold distance may be a distance at which a total non-radiative decay rate constant is equal to a total radiative decay rate constant. In some of such embodiments, device may include an outcoupling layer is disposed over the enhancement layer on the opposite side of the emissive area.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

In some embodiments, a compound in an emissive material and/or layer in an OLED may be used as a phosphorescent sensitizer, where one or multiple layers in the OLED may include an acceptor in the form of one or more fluorescent and/or delayed fluorescence emitters. In some embodiments, the compound can be used as one component of an exciplex to be used as a sensitizer. As a phosphorescent sensitizer, the compound may be capable of energy transfer to the acceptor, and the acceptor may emit the energy or further transfer energy to a final emitter. The acceptor concentrations may range from 0.001% to 100%. The acceptor may be in either the same layer as the phosphorescent sensitizer or in one or more different layers. In some embodiments, the acceptor may be a TADF emitter. In some embodiments, the acceptor may be a fluorescent emitter. In some embodiments, the emission may arise from any or all of the sensitizer, acceptor, and/or final emitter.

On the other hand, E-type delayed fluorescence described above does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small ΔES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer having carbon nanotubes.

In some embodiments, the OLED further comprises a layer having a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes, including phosphor sensitized fluorescence.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

There are many display applications that would benefit from an AMOLED (active matrix organic light emitting device) display having a plurality of sub-pixels for each primary color (e.g., red, green, and blue primary colors) in the same pixel. To reduce manufacturing cost and/or complexity, it may be desirable to have three, or no more than three, OLED deposition and/or patterning steps be performed to form an OLED display. Embodiments of the disclosed subject matter, such as shown in FIG. 3A, provide a display architecture that includes a display usage mode which may be switched between different modes for display properties such as color, viewing angle, transparency, and the like.

Figure 3A:
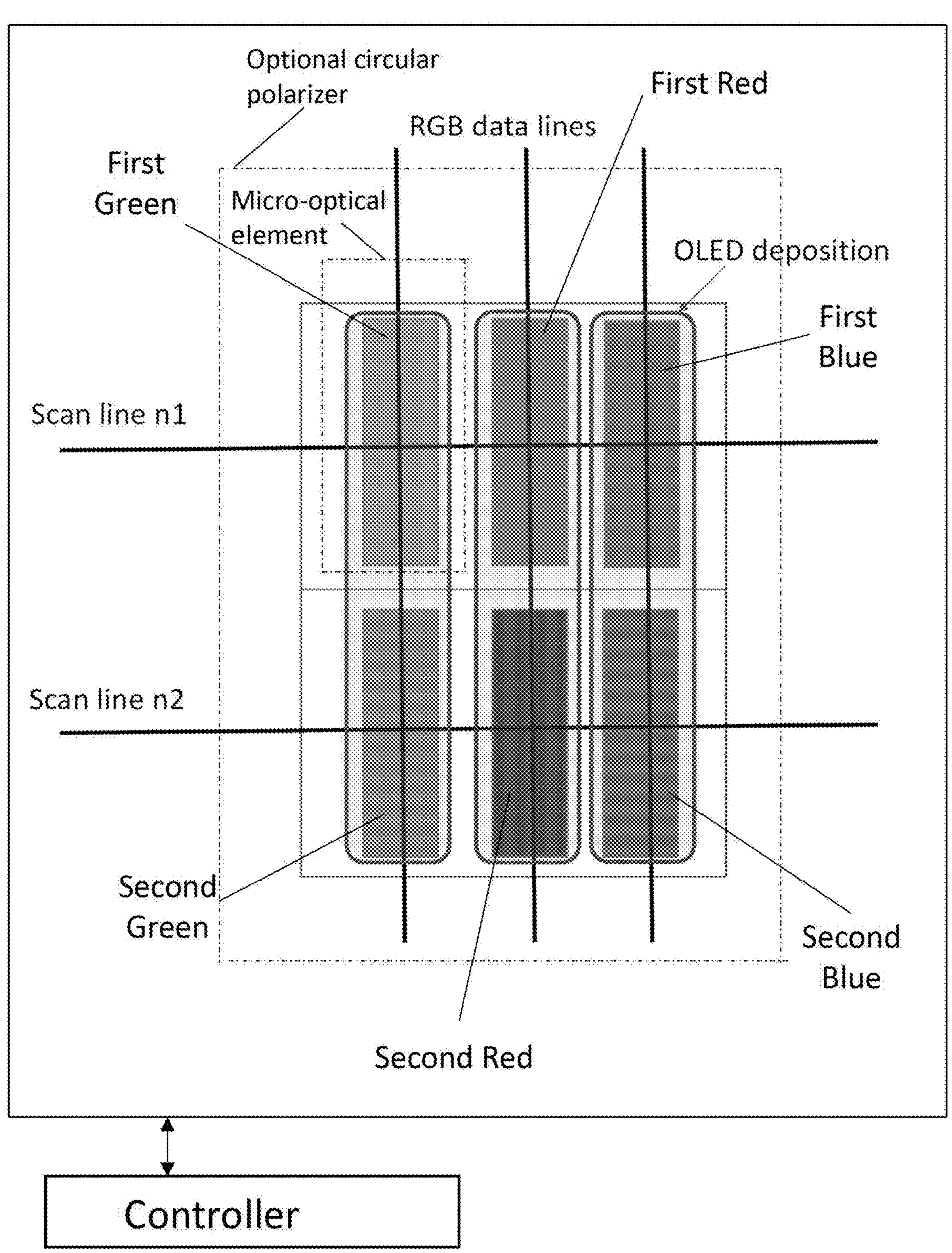
FIG. 3A shows an example sub-pixel arrangement for an OLED display according to an embodiment of the disclosed subject matter.

Some of the embodiments of the disclosed subject matter, such as shown in FIG. 3A, may include two sets of red, green, and blue (RGB) sub-pixels per pixel, with each set having different color saturation and/or transparency.

For example, higher color gamut images generally consume more power, so there is typically a trade-off between color gamut and power consumption. To reduce the power consumption of a display, two sets of RGB sub-pixels of the disclosed subject matter may be used. Less saturated colors that have lower power consumption may be used for lower color gamut images, and more saturated sub-pixels may be energized when increased color fidelity (e.g., an increased color gamut) is desirable. For example, documents such as spreadsheets do not typically need a display with a high color gamut. It may be desirable to have a display with an increased color gamut when watching movies.

In the embodiment shown in FIG. 3A, an OLED display may have two different viewing angles. For example, the OLED display may be configured to operate in a single user mode, where cavity OLEDs of the display may emit light in a forward direction with increased efficiency. In another example, the OLED display may be configured to operation a multi-user mode, where OLED emissions may be Lambertian with an increased viewing angle but having a higher power consumption.

The device of FIG. 3A may include a controller configured to select a transmission parameter of the OLED display to control an emission of light from the OLED display. In some embodiments, the device of FIG. 3A may include a controller configured to select a distribution of the red light, the green light, and/or the blue light through at least one of an anode and a cathode of the OLED display. For example, if one set of sub-pixels has a transparent anode and another set of sub-pixels has an opaque or reflecting anode (e.g., where the display is configured to be a top emitting device), the controller may switch the display between these two different anodes of the same color sub-pixel may change the light from the OLED display from a top emission display to a display emitting in both directions (i.e., top emission and bottom emission).

In some embodiments, such a display may be fabricated using three different RGB OLED depositions, as shown in FIG. 3A, with each deposition covering two independently addressable anode pads within each pixel. Each stack arrangement of the same color (e.g., red, green, and/or blue) within each pixel may be different by choice of anode material and/or thickness to provide a different cavity design to impact color saturation or viewing angle.

In embodiments of the disclosed subject matter, the device of FIG. 3A may be provided that includes an organic light emitting device (OLED) display having at least one pixel having a plurality of sub-pixels, such as shown in FIG. 3A. At least one color sub-pixel of the plurality of sub-pixels may be configured to output red light, at least one color sub-pixel of the plurality of sub-pixels is configured to output green light, and at least one color sub-pixel of the plurality of sub-pixels is configured to output blue light. For example, as shown in FIG. 3A, the pixel may include a first green sub-pixel and second green sub-pixel, a first red sub-pixel and a second red sub-pixel, and a first blue sub-pixel and a second blue sub-pixel. In this example, the first and second sub-pixels for a particular color may output the same range of wavelengths, a different range of wavelengths, and/or at least a portion of the range of wavelengths may overlap.

The OLED display of FIG. 3A may include the at least one color sub-pixel configured to output red light, the at least one color sub-pixel configured to output green light, and/or the at least one color sub-pixel configured to output blue light may each have more than one sub-pixel, such as shown in FIG. 3A (e.g., a first green sub-pixel and second green sub-pixel, a first red sub-pixel and a second red sub-pixel, and a first blue sub-pixel and a second blue sub-pixel).

The device of FIG. 3A may include a controller configured to select a color gamut of the OLED display. The color gamut may be selected by the controller by selecting one of the at least one color sub-pixel that is configured to output red light, selecting one of the at least one color sub-pixel that is configured to output green light, and selecting one of the at least one color sub-pixel configured to output blue light. In some embodiments, the controller may be configured to control the OLED display so that only one sub-pixel configured to output red light, green light, and/or blue light in any given pixel is illuminated at the same time.

In some embodiments of the disclosed subject matter, the controller of the device of FIG. 3A may be configured to select a viewing angle of the OLED display. The viewing angle may be selected by the controller by selecting one of the at least one color sub-pixel that is configured to output red light, selecting one of the at least one color sub-pixel that is configured to output green light, and/or selecting one of the at least one color sub-pixel configured to output blue light. That is, the selection of particular sub-pixels by the controller allow for the emission of light in a forward direction (e.g., for view by a single user). The controller may also be configured to control the sub-pixels to operate in a multi-user mode, where emissions by the controlled sub-pixels may be Lambertian with an increased viewing angle.

In some embodiments of the disclosed subject matter, the controller of the device of FIG. 3A may be configured to select a mode by which light is emitted from the OLED display. The controller may be configured to select a mode for the emission of light to be through the anode and/or the cathode. The controller may be configured to select a transmission of the OLED display.

In some embodiments of the disclosed subject matter, the controller of the device of FIG. 3A may be configured to control a luminance of white light output by the OLED display by controlling the at least one color sub-pixel configured to output red light, the at least one color sub-pixel configured to output green light, and/or the at least one color sub-pixel configured to output blue light. The controller may control the luminance of the white light output by the OLED display by maximizing the white luminance for one or more images and/or for one or more environments. For example, the controller may control the luminance of the white light output by the OLED display when outputting images with a white component that is greater than a predetermined white brightness level. In another example, the controller may control the luminance of the white light output by the OLED display when outputting images when the display is located in ambient environments having a brightness that is greater than a predetermined brightness level.

In some embodiments of the disclosed subject matter, the OLED display of the device of FIG. 3A may have only three OLED emitter depositions, where a first OLED emitter deposition includes the at least one color sub-pixel configured to emit red light, a second OLED emitter deposition includes the at least one color sub-pixel configured to emit green light, and a third OLED emitter deposition that includes the at least one color sub-pixel configured to emit blue light. As used throughout, the emitter depositions may be the emissive layer (EML) depositions that are formed via pixel resolution patterning operations, such as by using a fine metal shadow mask (FMM), photolithography, and the like. For example, the masking shown in FIGS. 4B-4C may be used, as described below. That is, the emitter depositions described throughout relate to the EML, and not the common organic layers, such as the hole injection layer (HIL), electron blocking layer (EBL), hole blocking layer (HBL), electron transport layer (ETL), charge generation layer (CGL), or the like.

In some embodiments of the disclosed subject matter, the OLED display of the device of FIG. 3A may have more than three OLED emitter depositions, where two or more depositions are used for a sub-pixel of the plurality of sub-pixels that is configured to output a first color of light and/or a second color light, where the first color and the second color are similar within a predetermined range of wavelengths. As shown in FIG. 3A, the pixel may include a first green sub-pixel and second green sub-pixel, a first red sub-pixel and a second red sub-pixel, and a first blue sub-pixel and a second blue sub-pixel. In some embodiments, four OLED depositions may be used, where one color of a sub-pixel (e.g., a blue sub-pixel) has two distinct depositions (e.g., a first blue deposition and a second blue deposition) to allow for a great differentiation in performance between similar color sub-pixels. In this example having four depositions, the other two depositions may be for different color sub-pixels (e.g., a red sub-pixel and a green sub-pixel). In another example, there may be five OLED depositions, where a first color sub-pixel has two distinct depositions, and a second sub-pixel has two distinct depositions, and a third color sub-pixel has a single deposition. In yet another example, there may be six OLED depositions, where each color of a sub-pixel (e.g., a blue sub-pixel) has two distinct depositions, such as shown in FIG. 3A. These are merely examples, and other combinations of OLED depositions may be used, with a particular color of sub-pixel having at least one deposition.

The OLED display of the device of FIG. 3A may have a plurality of OLED depositions, where a first OLED emitter deposition may include the at least one color sub-pixel configured to emit red light, a second OLED emitter deposition may include the at least one color sub-pixel configured to emit green light, a third OLED emitter deposition may include the at least one color sub-pixel configured to emit blue light, and a fourth OLED emitter deposition may include at least one color sub-pixel configured to emit yellow light.

In some embodiments, the OLED display of the device of FIG. 3A may have a plurality of OLED depositions, where a first OLED emitter deposition may be configured to produce blue light. The at least one pixel configured to emit blue light may use the blue light produced from the first OLED emitter deposition. A second OLED deposition may be configured to produce yellow light. The at least one sub-pixel configured to output red light may use at least one color altering layer and the yellow light produced from the second OLED deposition, and the at least one sub-pixel configured to emit green light may use the at least one color altering layer and the yellow light produced from the second OLED deposition.

The device of FIG. 3A may include where the at least one color sub-pixel of the plurality of sub-pixels that is configured to output red light has at least a first color sub-pixel and a second color sub-pixel. The at least one color sub-pixel of the plurality of sub-pixels that is configured to output green light may include at least a third color sub-pixel and a fourth color sub-pixel. The at least one color sub-pixel of the plurality of sub-pixels that is configured to output blue light may include at least a fifth color sub-pixel and a sixth color sub-pixel.

As shown in FIG. 3A, the device may include a plurality of data lines for each pixel of the plurality of pixels having a first data line to provide data to the first color sub-pixel and the second color sub-pixel, a second data line to provide data to the third color sub-pixel and the fourth color sub-pixel, and a third data line to provide data to the fifth color sub-pixel and the sixth color sub-pixel. The device may include a plurality of scan lines, such as shown in FIG. 3A, for each pixel of the plurality of pixels having a first scan line coupled to the first color sub-pixel, the third color sub-pixel, and the fifth color sub-pixel, and a second scan line coupled to the second color sub-pixel, the fourth color sub-pixel, and the sixth color sub-pixel.

In some embodiments, the first color sub-pixel, the third color sub-pixel, and the fifth color sub-pixel may be at least semi-transparent or transparent. In some embodiments, the first color sub-pixel, the third color sub-pixel, and the fifth color sub-pixel may have a different cavity design than the second color sub-pixel, the fourth color sub-pixel, and the sixth color sub-pixel.

The device may include three data lines to provide data to each pixel of the plurality of pixels, and two scan lines for each pixel of the plurality of pixels, where an anode property, a cathode property, and/or a common layer thickness differs in alternate row of the plurality of pixels. For the common layer thickness, electron blocking layers (EBLs) and/or hole blocking layers (HBLs) are generally not considered common layers, but may be used to alter the cavity length in similar color sub-pixels via variation of the thickness. Different electrode configurations for pixels of the OLED display may be used. For example, different transparent conductive oxides (TCOs) thicknesses may be used to vary the cavity lengths for different sub-pixels. In some embodiments, the device may include an anode property, a cathode property, and/or a common layer thickness that differs in sub-pixels of the same color within each pixel of the OLED display.

Cavity structures are often used to improve the efficiency of OLED displays, particularly where top emission can be employed. However, cavity structures typically rely on metallic anodes that are reflective, which can reduce the contrast ratio of OLED displays in bright ambient conditions. This typically requires such displays to use circular polarizers which reduce their overall efficiency.

In addition, these cavity structures often result in both luminance and color shifts with off angle viewing. In the embodiments of the disclosed subject matter, such as shown in FIG. 3B, an OLED display architecture may provide Lambertian emission, low reflection, and high efficiency.

Figure 3B:
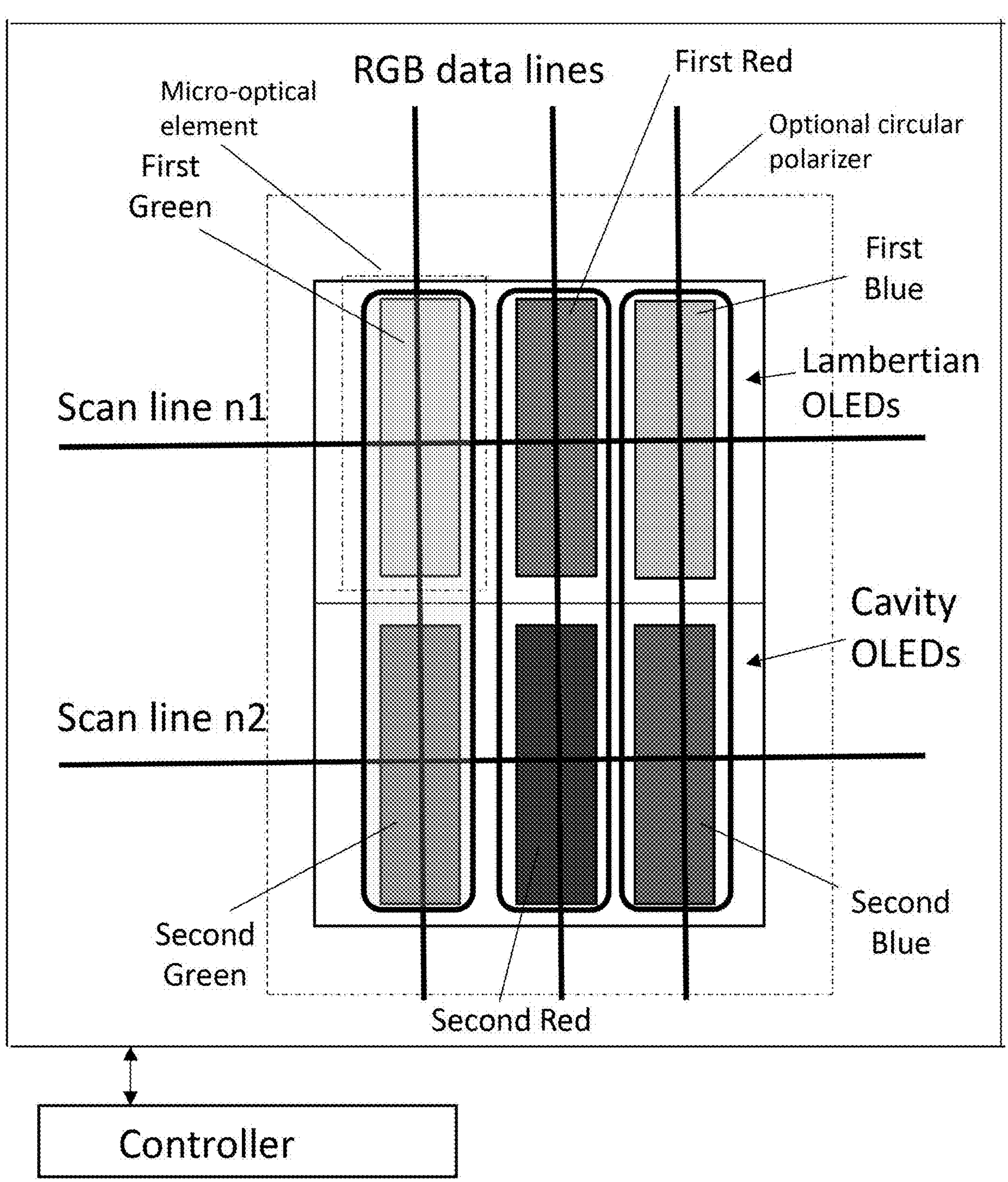
FIG. 3B shows an example sub-pixel arrangement that include Lambertian emission and cavity emission sub-pixels for an OLED display according to an embodiment of the disclosed subject matter

The display architecture shown in FIG. 3B may have a high color gamut, Lambertian emission, low reflectivity, and/or high efficiency based on having sub-pixels with a Lambertian, no cavity, and/or low reflection emission zone and with sub-pixels having a cavity emission zone based on a reflective electrode for each primary color in a full color OLED display.

The high efficiency for the OLED display in the arrangement shown in FIG. 3B may be achieved by removal of a polarizer, which may be enabled by low reflectivity because of a small portion of each pixel having a reflective anode (i.e., having cavity emission). In some embodiments, low reflectivity may be achieved through a combination of plasmonic PHOLEDs (Phosphorescent Organic Light-Emitting Diodes) having low reflectivity anodes.

In the Lambertian emission sub-pixels of the arrangement shown in FIG. 3B, plasmonic PHOLEDs may be used in combination with a scattering outcoupling scheme. Each RGB (red, green, blue) color may have two emission zones. A first emission zone may be based on a transparent and/or bottom emission, no cavity design having Lambertian emission and low reflectance. The first emission zone may include a first green sub-pixel, a first red sub-pixel, and a first blue sub-pixel shown in FIG. 3B. A second emission zone may have a cavity design to provide high color saturation and high efficiency, but with higher reflectance than the first emission zone. The second emission zone may include a second green sub-pixel, a second red sub-pixel, and a second blue sub-pixel shown in FIG. 3B.

The arrangement shown in FIG. 3B may have two scan lines per pixel, where scan line n1 may be for the Lambertian OLEDs, and a scan line n2 for the cavity OLED. There may be six sub-pixels with three RGB data lines (i.e., a first data line for green sub-pixels, a second data line for red sub-pixels, and a third data line for blue sub-pixels). In some embodiments, the OLED device may have three OLED depositions, and in other embodiments, there may be six OLED depositions.

In the arrangement shown in FIG. 3B, there may be no polarizers used. In some embodiments, color filters may be used to reduce display reflectance. In some embodiments, patterned polarizers may be disposed over the cavity emission areas and/or over areas of high reflectance, or may patterned such that the polarizers are only disposed over cavity emission areas, and/or disposed over areas of high reflectance.

There are many applications that would benefit from an AMOLED display having high efficiency, Lambertian emission, and/or a high color gamut, such as with the device shown in FIG. 3B. One way to achieve Lambertian emission is to avoid using a cavity stack for OLED emission. However, the arrangement generally leads to lower efficiency devices and a less saturated display color gamut. Higher efficiency may be obtained by employing a cavity design (e.g., either top or bottom emission) based on the use of a reflective electrode one side of the OLED stack and a second semi-transparent electrode through which light exits the device. While the use of a cavity design increases the light output from an OLED and therefore increases its efficiency in a direction normal to the display surface, such an arrangement may result in changes to output luminance and color with viewing angle.

A further increase in display efficiency may be enabled by removing the circular polarizer which is added to reduce reflections from any metal electrodes in the display but at a penalty of reducing the display efficiency by around 55%. In the optimized OLED display designs of the disclosed subject matter, the arrangements include mostly Lambertian emission to reduce luminance and/or color shifts with viewing angle, low reflection (i.e., from the relatively small area of the pixels having metallic electrodes for cavity emission) so that the circular polarizer can be eliminated (especially if color filters are employed to reduce unwanted reflections).

The new display architecture shown in FIG. 3B may have two sets of primary color sub-pixels. One set of sub-pixels may be formed by Lambertian emission devices with little or no reflectivity from metallic electrodes. A second set of sub-pixels may be formed by cavity structures with metallic or reflecting electrodes, which have higher device efficiencies normal to the substrate but may have changes in color and/or luminance over a viewing angle.

For most images to be displayed on a display device, highly saturated colors are not required. Such images may be rendered using the Lambertian sub-pixels of the arrangement shown in FIG. 3B, and the cavity OLED sub-pixels shown in FIG. 3B may be used when more saturated colors are required and/or when the higher efficiencies of cavity structures are needed. System electronics (e.g., of a display device) may use and energize a combination of both sub-pixels for each color to render an image to balance or optimize display performance for viewing angle, efficiency and color gamut. As higher efficiency is typically more important at a higher display luminance, the system electronics may be adjusted to have more of the light for each primary color come from the cavity devices versus the Lambertian devices as the overall luminance increases.

Artificial Intelligence (AI) and/or Machine Learning may be used with and/or to train a controller for the arrangement shown in FIG. 3B, so that the Lambertian and/or the cavity sub-pixels of the display may be used based on the image to be rendered in real time.

In some embodiments, selecting cavity sub-pixels versus Lambertian sub-pixels by the controller in the arrangement shown in FIG. 3B may be different for each color (e.g., RGB colors) dependent on image being rendered by the display. In some embodiments, the same or different emitters may be used to produce the Lambertian emission versus the cavity emission for each color. That is, there may be the same peak wavelength but different FWHM (Full Width Half-Maximum), or there may be a different peak wavelength.

In some embodiments, at least one sub-pixel of the plurality of sub-pixels of the device may be a phosphorescent sub-pixel, and/or a phosphorescence sensitized fluorescence sub-pixel. In some such embodiments, the fluorescent emitter in the fluorescence sub-pixel may be a singlet emitter or a doublet emitter. In some of such embodiments, the singlet emitter may include a TADF emitter. In some embodiments, at least one sub-pixel of the plurality of sub-pixels may have an emissive layer including a phosphorescent material.

In some embodiments, the selection of whether display renders images using Lambertian or cavity emission may be image and/or mode dependent. For example, a laptop may have two display surfaces, which each display surface having the arrangement as shown in FIG. 3B. When both surfaces are showing unrelated and/or different images, cavity emission may be used. If the two surfaces show one image, then Lambertian emission may be used. In some implementations, Artificial Intelligence, Machine Learning, and/or convolutional neural networks may be used to interpret an image to be rendered on a display. This may be to adjust the performance of the display rendering the image. That is, the emission mode may be adjusted for each color from each subpixel to balance cavity versus Lambertian emission based on an overall display image and/or usage scenario. Some embodiments may also provide for optimization of a viewing angle, color, and/or power consumption.

According to the embodiment shown in FIG. 3B, a device may include an OLED display comprising at least one pixel having a plurality of sub-pixels, where at least one color sub-pixel of the plurality of sub-pixels is configured to output red light, at least one color sub-pixel of the plurality of sub-pixels is configured to output green light, and/or at least one color sub-pixel of the plurality of sub-pixels is configured to output blue light. The device may include at least two of the at least one color sub-pixel configured to output red light, the at least one color sub-pixel configured to output green light, and the at least one color sub-pixel configured to output blue light have at least one sub-pixel that is configured to have a Lambertian emission (e.g., with the Lambertian OLEDs shown in FIG. 3B), and at least one sub-pixel having a microcavity that may be configured for direct emission (e.g., with the cavity OLEDs shown in FIG. 3B) such that a first ratio of light from the direct emission sub-pixel in a cone having an angle of 0-20° in a normal direction relative to an overall light emission from the direct emission sub-pixel that may be at least 10%, at least 20%, and/or at least 30% higher than a second ratio of light from the Lambertian emission sub-pixel in a cone having an angle of 0-20° in a normal direction relative to an overall light emission from the Lambertian sub-pixel.

The device of FIG. 3B may include a controller to control the OLED display, where a ratio between a luminance of the at least one sub-pixel configured to have the direct emission and the at least one sub-pixel may be configured to have the Lambertian emission increases when the controller controls the OLED display to increase a luminance of the OLED display.

In some implementations, the ratio between a luminance of the at least one sub-pixel configured to have the direct emission and the at least one sub-pixel configured to have the Lambertian emission may be increased by the controller based on a color of a pixel of the at least one pixel of the OLED display.

The ratio between a luminance of the at least one sub-pixel may be configured to have the direct emission and the at least one sub-pixel may be configured to have the Lambertian emission changes across the OLED display may be controlled based on at least one control signal output by the controller.

In some embodiments, CIE 1931 color space values for a pixel that may include the at least one sub-pixel configured to have the Lambertian emission and the at least one sub-pixel may be configured to have the direct emission change based on at least one control signal output by the controller.

At least one color sub-pixel of the plurality of sub-pixels of the device may be configured to output light of another color. The device of FIG. 3B may be configured to output light using at least two of the at least one color sub-pixel configured to output red light, the at least one color sub-pixel configured to output green light, the at least one color sub-pixel configured to output blue light, and/or the at least one color sub-pixel configured to output light of another color. The device of FIG. 3B may be configured with the at least one sub-pixel having Lambertian emission for each color and the at least one sub-pixel having the microcavity configured for direct emission for each color.

In some embodiments, the device of FIG. 3B may include at least one circular polarizer that may be patterned over regions of the OLED display having at least one reflective electrode. The at least one reflective electrode may be a backplane electrode of the OLED display of FIG. 3B, and/or an electrode for a cavity OLED stack of the OLED display. In some embodiments, the device of FIG. 3B may include at least one circular polarizer that is patterned over regions of the OLED display having direct or microcavity emission. In some embodiments, the device may include at least one circular polarizer that is disposed over less than 80%, less than 60%, less than 40%, less than 20%, and/or less than 10% of an active area of the OLED display.

The controller of the device of FIG. 3B may be configured to select the at least one sub-pixel that has the Lambertian emission and the at least one sub-pixel having the microcavity configured for direct emission based on an image to be displayed by the OLED display, and/or an operating mode of the OLED display.

In some embodiments, the device of FIG. 3B having at least one sub-pixel that has the Lambertian emission and the at least one sub-pixel having the microcavity may be configured for direct emission have different or the same emitters.

The device having at least one sub-pixel that has the Lambertian emission and the at least one sub-pixel having the microcavity may be configured for direct emission have different emitters or the same emitters for each color, where each color has a peak wavelength that is substantially the same and different full width at half maximum (FWHM), and/or different peak wavelengths. To be substantially the same, each color may have less than a 2, 3, 4, 5, or 6 nm difference in peak wavelength.

The controller of the device shown in FIG. 3B may be configured to select a color gamut of the OLED display, where the color gamut may be selected by the controller by selecting one of the at least one color sub-pixel that is configured to output red light, selecting one of the at least one color sub-pixel that is configured to output green light, and/or selecting one of the at least one color sub-pixel configured to output blue light. The controller may be configured to control the OLED display so that only one sub-pixel configured to output red light, green light, and/or blue light in any given pixel is illuminated at the same time.

The controller of the device of FIG. 3B may be configured to select a viewing angle of the OLED display, where the viewing angle may be selected by the controller by selecting one of the at least one color sub-pixel that is configured to output red light, selecting one of the at least one color sub-pixel that is configured to output green light, and/or selecting one of the at least one color sub-pixel configured to output blue light.

In some embodiments, the controller of the device shown in FIG. 3B may select a transmission parameter of the OLED display to control an emission of light from the OLED display. The controller of the device of FIG. 3 may be configured to select a distribution of the red light, the green light, and/or the blue light through at least one of an anode and a cathode of the OLED display.

The controller of the device of FIG. 3B may be configured to control a luminance of white light output by the OLED display by controlling the at least one color sub-pixel configured to output red light, the at least one color sub-pixel configured to output green light, and/or the at least one color sub-pixel configured to output blue light.

The OLED display of the device of FIG. 3B may have only three OLED emitter depositions, where a first OLED emitter deposition includes the at least one color sub-pixel configured to emit red light, a second OLED emitter deposition includes the at least one color sub-pixel configured to emit green light, and/or a third OLED emitter deposition that includes the at least one color sub-pixel configured to emit blue light. The OLED display of the device may have more than one deposition for sub-pixels configured to emit red light, green light, and/or blue light.

The OLED display of the device of FIG. 3B may include more than three OLED emitter depositions, where two or more depositions are used for a sub-pixel of the plurality of sub-pixels that is configured to output a first color of light and/or a second color light, where the first color and the second color are similar within a predetermined range of wavelengths.

In some embodiments, the OLED display of the device of FIG. 3B may have a plurality of OLED depositions, where a first OLED emitter deposition includes the at least one color sub-pixel configured to emit red light, a second OLED emitter deposition includes the at least one color sub-pixel configured to emit green light, a third OLED emitter deposition that includes the at least one color sub-pixel configured to emit blue light, and/or a fourth OLED emitter deposition that includes at least one color sub-pixel configured to emit yellow light.

The OLED display of the device of FIG. 3B may have a plurality of OLED depositions, where a first OLED emitter deposition is configured to produce blue light, and where the at least one pixel configured to emit blue light uses the blue light produced from the first OLED emitter deposition. A second OLED deposition may be configured to produce yellow light. The at least one sub-pixel configured to output red light may use at least one color altering layer and the yellow light produced from the second OLED deposition, the at least one sub-pixel configured to emit green light may use the at least one color altering layer and the yellow light produced from the second OLED deposition.

The at least one color sub-pixel of the plurality of sub-pixels of the device of FIG. 3B configured to output red light may include at least a first color sub-pixel and a second color sub-pixel. The at least one color sub-pixel of the plurality of sub-pixels that is configured to output green light may include at least a third color sub-pixel and a fourth color sub-pixel. The at least one color sub-pixel of the plurality of sub-pixels that is configured to output blue light may include at least a fifth color sub-pixel and a sixth color sub-pixel. The device of FIG. 3B may have a plurality of data lines (e.g., RGB data lines as shown in FIG. 3B) for each pixel of the plurality of pixels, with a first data line to provide data to the first color sub-pixel and the second color sub-pixel, a second data line to provide data to the third color sub-pixel and the fourth color sub-pixel, a third data line to provide data to the fifth color sub-pixel and the sixth color sub-pixel. The device may have a plurality of scan lines (e.g., scan line n1, scan line n2, and the like as shown in FIG. 3B) for each pixel of the plurality of pixels, with a first scan line coupled to the first color sub-pixel, the third color sub-pixel, and the fifth color sub-pixel, and a second scan line coupled to the second color sub-pixel, the fourth color sub-pixel, and the sixth color sub-pixel. The first color sub-pixel, the third color sub-pixel, and the fifth color sub-pixel may be at least semi-transparent or transparent. The sub-pixel may be semi-transparent or transparent when the optical transmission of visible light through the sub-pixel is greater than 10% wen the sub-pixel is in the off state, where no power is applied to the OLED device in that sub-pixel. The first color sub-pixel, the third color sub-pixel, and the fifth color sub-pixel may have a different cavity design than the second color sub-pixel, the fourth color sub-pixel, and the sixth color sub-pixel.

The device shown in FIG. 3B may include three data lines (e.g., RGB data lines as s) to provide data to each pixel of the plurality of pixels, and may have two scan lines for each pixel of the plurality of pixels, where an anode property, a cathode property, and/or a common layer thickness differs in alternate row of the plurality of pixels. In some embodiments, the device of FIG. 3B may include an anode property, a cathode property, and/or a common layer thickness differs in sub-pixels of the same color within each pixel of the OLED display.

In some embodiments, the device shown in at least FIG. 3B may include an enhancement layer that is disposed over an emissive area of at least one sub-pixel that is configured to have a Lambertian emission and/or at least one sub-pixel having a microcavity configured for direct emission. The enhancement layer may include a plasmonic structure that is disposed a predetermined threshold distance from the emissive area. The predetermined threshold distance may be a distance at which a total non-radiative decay rate constant is equal to a total radiative decay rate constant. In some embodiments, the device may include an outcoupling layer that is disposed over the enhancement layer on the opposite side of the emissive area.

In some embodiments, a method may be used to form the device shown in FIGS. 3A-3B. The method may include depositing material for a plurality of pixels of an organic light emitting device (OLED) device using a mask. The mask may have a shape configured to deposit a blocking or prime layer in at least three sub-pixels of each pixel of the plurality of pixels to be deposited. At least one color sub-pixel of the at least three sub-pixels plurality of sub-pixels deposited may be configured to output red light, at least one color sub-pixel of the at least three sub-pixels is configured to output green light, and at least one color sub-pixel of the at least three sub-pixel is configured to output blue light.

The method may include having a cavity length of the at least one color sub-pixel configured to output red light, the at least one color sub-pixel configured to output green light, or the at least one color sub-pixel configured to output blue light is different via common layers deposited under at least one more adjacent sub-pixels.

The method may include forming different cavity optics for the more than one color sub-pixel configured to output red light, the more than one color sub-pixel configured to output green light, and/or the more than one color sub-pixel configured to output blue light.

In some embodiments, a device may include an organic light emitting device (OLED) display comprising at least one pixel having a plurality of sub-pixels. The device may have at least one color sub-pixel of the plurality of sub-pixels is configured to output red light, at least one color sub-pixel of the plurality of sub-pixels is configured to output green light, and at least one color sub-pixel of the plurality of sub-pixels is configured to output blue light. The device may have at least two of the at least one color sub-pixel configured to output red light, the at least one color sub-pixel configured to output green light, and/or the at least one color sub-pixel configured to output blue light have a micro-optical element disposed over at least part of a sub-pixel. The micro-optical element may have a refractive index that is less than 1, less than 0.75, less than 0.5, and/or less than 0.25. The micro-optical element may have a transmittance of less than 90%, less than 80%, less than 70%, and/or less than 60%. The micro-optical element may have a diffraction based reflective characteristic whereby reflection is caused by advantageously spaced variations in refractive index which selectively reflect one or more desired wavelength bands in order to enhance performance.

Figures 4A, 4B, 4C:
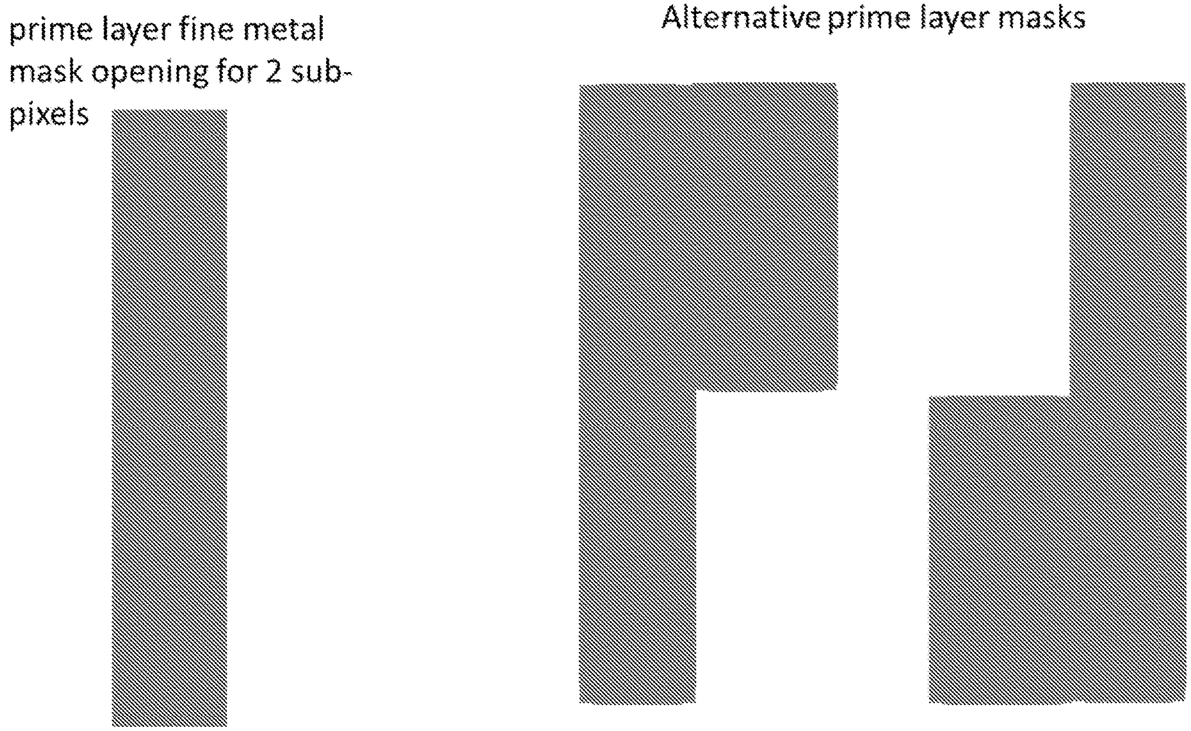
FIG. 4A shows a conventional emissive layer or prime layer fine metal mask opening for two sub-pixels.
FIGS. 4B-4C show example mask arrangements according to embodiments of the disclosed subject matter.

FIG. 4A shows a conventional masking arrangement to form an emissive layer, and FIGS. 4B-4C show novel masking arrangements to form the emissive layer, such as for a six sub-pixel arrangement, according to embodiments of the disclosed subject matter. In particular, FIG. 4A shows an example conventional fine metal shadow mask used to deposit two sub-pixels, which typically includes a monochrome emissive layer or prime layer (i.e., blocking layer). FIGS. 4B-4C show fine metal masks that may allow a blocking and/or prime layer to be deposited under three sub-pixels. The masks shown in FIGS. 4B-4C may allow for more thickness options when optimizing color, efficiency, angular dependence, and the like for two red, green, or blue sub-pixels, respectively. For example, two of the green sub-pixels may have different cavity lengths without an additional deposition step.

Embodiments of the disclosed subject matter may include a method of depositing material for a plurality of pixels of an organic light emitting device (OLED) device using a mask, such as the masks shown in FIGS. 4B-4C. The mask may have a shape configured to deposit a blocking or prime layer in at least three sub-pixels of each pixel of the plurality of pixels to be deposited. At least one color sub-pixel of the at least three sub-pixels plurality of sub-pixels deposited is configured to output red light, at least one color sub-pixel of the at least three sub-pixels is configured to output green light, and/or at least one color sub-pixel of the at least three sub-pixel is configured to output blue light.

The deposition may be performed so that a cavity length of the at least one color sub-pixel configured to output red light, the at least one color sub-pixel configured to output green light, and/or the at least one color sub-pixel configured to output blue light is different via common layers deposited under at least one more adjacent sub-pixels. The method may include forming different cavity optics for the more than one color sub-pixel configured to output red light, the more than one color sub-pixel configured to output green light, and/or the more than one color sub-pixel configured to output blue light.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:

an organic light emitting device (OLED) display comprising at least one pixel having a plurality of sub-pixels, wherein at least one color sub-pixel of the plurality of sub-pixels is configured to output red light, wherein at least one color sub-pixel of the plurality of sub-pixels is configured to output green light, wherein at least one color sub-pixel of the plurality of sub-pixels is configured to output blue light, wherein at least two of the group consisting of: the at least one color sub-pixel configured to output red light, the at least one color sub-pixel configured to output green light, and the at least one color sub-pixel configured to output blue light have at least one sub-pixel that is configured to have a Lambertian emission, and at least one sub-pixel having a microcavity configured for direct emission such that a first ratio of light from the direct emission sub-pixel in a cone having an angle of 0-20° in a normal direction relative to an overall light emission from the direct emission sub-pixel is selected from the group consisting of: at least 10%, at least 20%, at least 30% higher than a second ratio of light from the Lambertian emission sub-pixel in a cone having an angle of 0-20° in a normal direction relative to an overall light emission from the Lambertian sub-pixel, and wherein the at least one sub-pixel that has the Lambertian emission and the at least one sub-pixel having the microcavity configured for direct emission have the same emitters with the same chemical composition.

2. The device of claim 1, further comprising:

a controller to control the OLED display, wherein a ratio between a luminance of the at least one sub-pixel configured to have the direct emission and the at least one sub-pixel configured to have the Lambertian emission increases when the controller controls the OLED display to increase a luminance of the OLED display.

3. The device of claim 1, further comprising:

a controller to control the OLED display, wherein a ratio between a luminance of the at least one sub-pixel configured to have the direct emission and the at least one sub-pixel configured to have the Lambertian emission increases based on a color of a pixel of the at least one pixel of the OLED display.

4. The device of claim 1, further comprising:

a controller to control the OLED display, wherein a ratio between a luminance of the at least one sub-pixel configured to have the direct emission and the at least one sub-pixel configured to have the Lambertian emission changes across the OLED display based on at least one control signal output by the controller.

5. The device of claim 1, further comprising:

a controller to control the OLED display, wherein CIE 1931 color space values for a pixel that include the at least one sub-pixel configured to have the Lambertian emission and the at least one sub-pixel configured to have the direct emission change based on at least one control signal output by the controller.

6. The device of claim 1, wherein at least one color sub-pixel of the plurality of sub-pixels is configured to output light of another color, and wherein the device is configured to output light using at least two of the group consisting of: the at least one color sub-pixel configured to output red light, the at least one color sub-pixel configured to output green light, the at least one color sub-pixel configured to output blue light, and the at least one color sub-pixel configured to output light of another color.

7. The device of claim 6, wherein the device is configured with the at least one sub-pixel having Lambertian emission for each color and the at least one sub-pixel having the microcavity configured for direct emission for each color.

8. The device of claim 1, further comprising:

at least one circular polarizer that is patterned over regions of the OLED display having at least one reflective electrode.

9. The device of claim 8, wherein the at least one reflective electrode is selected from the group consisting of: a backplane electrode of the OLED display, and an electrode for a cavity OLED stack of the OLED display.

10. The device of claim 1, further comprising:

at least one circular polarizer that is patterned over regions of the OLED display having direct or microcavity emission.

11. The device of claim 1, further comprising:

at least one circular polarizer that is disposed over at least one selected from the group consisting of: less than 80%, less than 60%, less than 40%, less than 20%, and less than 10% of an active area of the OLED display.

12. The device of claim 1, further comprising:

a controller configured to select the at least one sub-pixel that has the Lambertian emission and the at least one sub-pixel having the microcavity configured for direct emission based on at least one selected from the group consisting of: an image to be displayed by the OLED display, and an operating mode of the OLED display.

13. The device of claim 1, wherein the at least one sub-pixel that has the Lambertian emission and the at least one sub-pixel having the microcavity configured for direct emission have the same emitters with the same chemical composition for each color, and wherein each color has at least one selected from the group consisting of: a peak wavelength that is substantially the same and different full width at half maximum (FWHM), and different peak wavelengths.

14. The device of claim 1, further comprising:

a controller configured to select a color gamut of the OLED display, wherein the color gamut is selected by the controller by selecting one of the at least one color sub-pixel that is configured to output red light, selecting one of the at least one color sub-pixel that is configured to output green light, and selecting one of the at least one color sub-pixel configured to output blue light.

15. The device of claim 14, wherein the controller is configured to control the OLED display so that only one sub-pixel configured to output at least one selected from the group consisting of: red light, green light, and blue light in any given pixel is illuminated at the same time.

16. The device of claim 1, further comprising:

a controller configured to select a viewing angle of the OLED display, wherein the viewing angle is selected by the controller by selecting one of the at least one color sub-pixel that is configured to output red light, selecting one of the at least one color sub-pixel that is configured to output green light, and selecting one of the at least one color sub-pixel configured to output blue light.

17. The device of claim 1, further comprising:

a controller configured to select a transmission parameter of the OLED display to control an emission of light from the OLED display.

18. The device of claim 1, wherein the device is at least one type selected from the group consisting of: a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

19. A device comprising:

an organic light emitting device (OLED) display comprising at least one pixel having a plurality of sub-pixels, wherein at least one color sub-pixel of the plurality of sub-pixels is configured to output red light, wherein at least one color sub-pixel of the plurality of sub-pixels is configured to output green light, wherein at least one color sub-pixel of the plurality of sub-pixels is configured to output blue light, and wherein at least two of the group consisting of: the at least one color sub-pixel configured to output red light, the at least one color sub-pixel configured to output green light, and the at least one color sub-pixel configured to output blue light have the same emitter with the same chemical composition and have a micro-optical element disposed over at least part of a sub-pixel.

* * * * *